United States Patent
Qiao et al.

(10) Patent No.: US 12,463,053 B2
(45) Date of Patent: Nov. 4, 2025

(54) METHOD FOR ETCHING HIGH ASPECT RATIO STRUCTURES

(71) Applicant: Applied Materials, Inc., Santa Clara, CA (US)

(72) Inventors: Feng Qiao, Santa Clara, CA (US);
Hailong Zhou, Santa Clara, CA (US);
Qian Fu, Santa Clara, CA (US);
Sangjun Park, Santa Clara, CA (US);
Jayoung Choi, Santa Clara, CA (US);
Radhe Agarwal, Santa Clara, CA (US);
Tong Liu, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 231 days.

(21) Appl. No.: 18/193,455

(22) Filed: Mar. 30, 2023

(65) Prior Publication Data
US 2024/0332031 A1   Oct. 3, 2024

(51) Int. Cl.
*H01L 21/3213*   (2006.01)
*H01L 21/3065*   (2006.01)

(52) U.S. Cl.
CPC .... *H01L 21/32137* (2013.01); *H01L 21/3065* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 11,527,414 B2 | 12/2022 | Fung et al. | |
| 2006/0264054 A1 | 11/2006 | Gutsche et al. | |
| 2007/0199922 A1* | 8/2007 | Shen | H01L 21/76814 216/76 |
| 2008/0286978 A1* | 11/2008 | Chen | H01L 21/30655 438/713 |
| 2010/0105208 A1 | 4/2010 | Winniczek et al. | |
| 2019/0362984 A1 | 11/2019 | Katsunuma | |
| 2022/0068661 A1 | 3/2022 | Shaw et al. | |
| 2022/0199417 A1 | 6/2022 | Henri et al. | |
| 2022/0351982 A1 | 11/2022 | Shen et al. | |

OTHER PUBLICATIONS

International Search Report and Written Opinion for PCT/US2024/011499 dated May 9, 2024.

* cited by examiner

*Primary Examiner* — Stephanie P Duclair
(74) *Attorney, Agent, or Firm* — Patterson + Sheridan, LLP

(57) ABSTRACT

A method and system for etching high aspect ratio structures in a semiconducting processing chamber are disclosed herein. In one example, a method of patterning a substrate comprises etching the substrate to form a recess, depositing a passivation layer on sidewalls of the recess, treating the passivation layer, and etching the recess to a second depth. The substrate etch forms a recess to a first depth, the substrate having a mask layer disposed thereon. The treating of the passivation layer is for removal of a clogging material formed from an etch byproduct on the mask layer. The etching the recess to a second depth while maintaining a minimum variation of a recess sidewall width.

17 Claims, 6 Drawing Sheets

METHOD FOR ETCHING HIGH ASPECT RATIO STRUCTURES

BACKGROUND

Field

Embodiments of the present disclosure generally relate to a semiconductor etch method and system for the same. More specifically, embodiments of the disclosure relate to an etch method for creating high aspect ratio device structures.

Description of the Related Art

In semiconductor manufacturing, integrated circuits (IC) are formed on semiconductor substrates through various manufacturing steps, including etching. Conventional etch processes employed for film stack etching utilize a single etch process to achieve a deep structure. These processes may be repeated to achieve the desired depth at the expense of a desired vertical profile. These undesired vertical profiles may lead to poor device performance or device failure. Thus, there is a need for an improved method of etching high aspect ratio structures with desired vertical profiles.

SUMMARY

A method and system for etching high aspect ratio structures in a semiconducting processing chamber are disclosed herein. In one example, a method of patterning a substrate comprises etching the substrate to form a recess, depositing a passivation layer on sidewalls of the recess, treating the passivation layer, and etching the recess to a second depth. The substrate etch forms a recess to a first depth, the substrate having a mask layer disposed thereon. The treating of the passivation layer is for removal of a clogging material formed from an etch byproduct on the mask layer. The etching the recess to a second depth while maintaining a minimum variation of a recess sidewall width.

In another example, a method of patterning a substrate comprises etching a substrate to remove a thin layer of oxidation to expose a silicon containing film stack, etching the substrate to form a recess to a first depth within the film stack, oxidizing the sidewalls of the recess and the inner sidewalls of the mask layer, exposing the mask layer sidewalls by a controlled etch, repeated the operations, etching the recess to a final depth while maintaining vertical profile. The substrate comprising a mask layer disposed above the film stack, the mask layer having inner sidewalls, the film stack disposed above the substrate, wherein etching the substrate comprises generating a plasma from a gas mixture of $Cl_2$, HBr, $O_2$, and Ar, and exposing the substrate to the plasma for about 10 seconds to about 200 seconds. The oxidizing of the sidewalls of the recess and the inner sidewalls of the mask layer by exposing the substrate to a generated oxygen plasma for about 10 seconds to about 20 seconds, the mask layer inner sidewalls having an etch byproduct, wherein the etch byproduct is silicon-containing. The exposing the mask layer sidewalls by a controlled etch, the controlled etch comprising generating a plasma from a gas mixture of $NF_3$, Ar, and $O_2$ and exposing the substrate to the plasma for about 10 seconds to about 200 seconds. The etching of the recess to a final depth while maintaining vertical profile of the first depth to within 5 nanometers of a center of the recess, etching the recess to a second depth.

In yet another example, a system to process semiconductor substrates comprising, a chamber, and a system controller. The chamber comprises a lid, a body, a sidewall, and a substrate support. A process volume is defined by the lid, body, and sidewall of the chamber. The system controller is coupled to the chamber, the controller having a non-transitory computer readable medium having stored thereon instructions, which, when executed by a processor, causes the process to perform operations of (a) etching a substrate to remove a thin layer of oxidation to expose a silicon containing film stack, (b) etching a substrate to form a recess to a first depth within the substrate, the substrate having a mask layer disposed thereon, (c) depositing a passivation layer on sidewalls of the recess, (d) treating the passivation layer to remove a clogging material formed from an etch byproduct on the mask layer, and (e) etching the recess to a second depth while maintaining a minimum variation of a recess sidewall width.

In another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

Many of the details, dimensions, angles, and other features shown in the Figures are merely illustrative of particular implementations. Accordingly, other implementations can have other details, components, dimensions, angles, and features without departing from the spirit or scope of the present disclosure. In addition, further implementations of the disclosure can be practiced without several of the details described below.

DETAILED DESCRIPTION

The present disclosure provides a method for etching high aspect ratio structures for use in three dimensional (3D)

dynamic random access memory (DRAM) devices. It has been found that reliably producing high aspect ratio features is one of the key technology challenges for the next generation of semiconductor devices. One method of forming high aspect ratio features uses a plasma assisted etching process to form high aspect ratio openings in a material layer, such as a dielectric layer or stacked structure, of a substrate. Unfortunately, conventional etch processes employed for the creation of high aspect ratio openings in the stacked structure utilize a single etch process which is not able to achieve high aspect ratios of 100:1 or greater while maintaining desired critical dimensions. To resolve this issue, an iterative method of etching, adding a passivation layer, and applying a passivation layer treatment is utilized to achieve better vertical profiles (e.g., maintaining critical dimensions) while obtaining desired high aspect ratio structures of 100:1 or greater. This advantageously results in high aspect ratio structures that are within a 10 nanometer tolerance allowing for increased yield, reduced waste, increased efficiency of processing, lower cost of ownership, and uniform integrated circuit fabrication.

Figure 1:
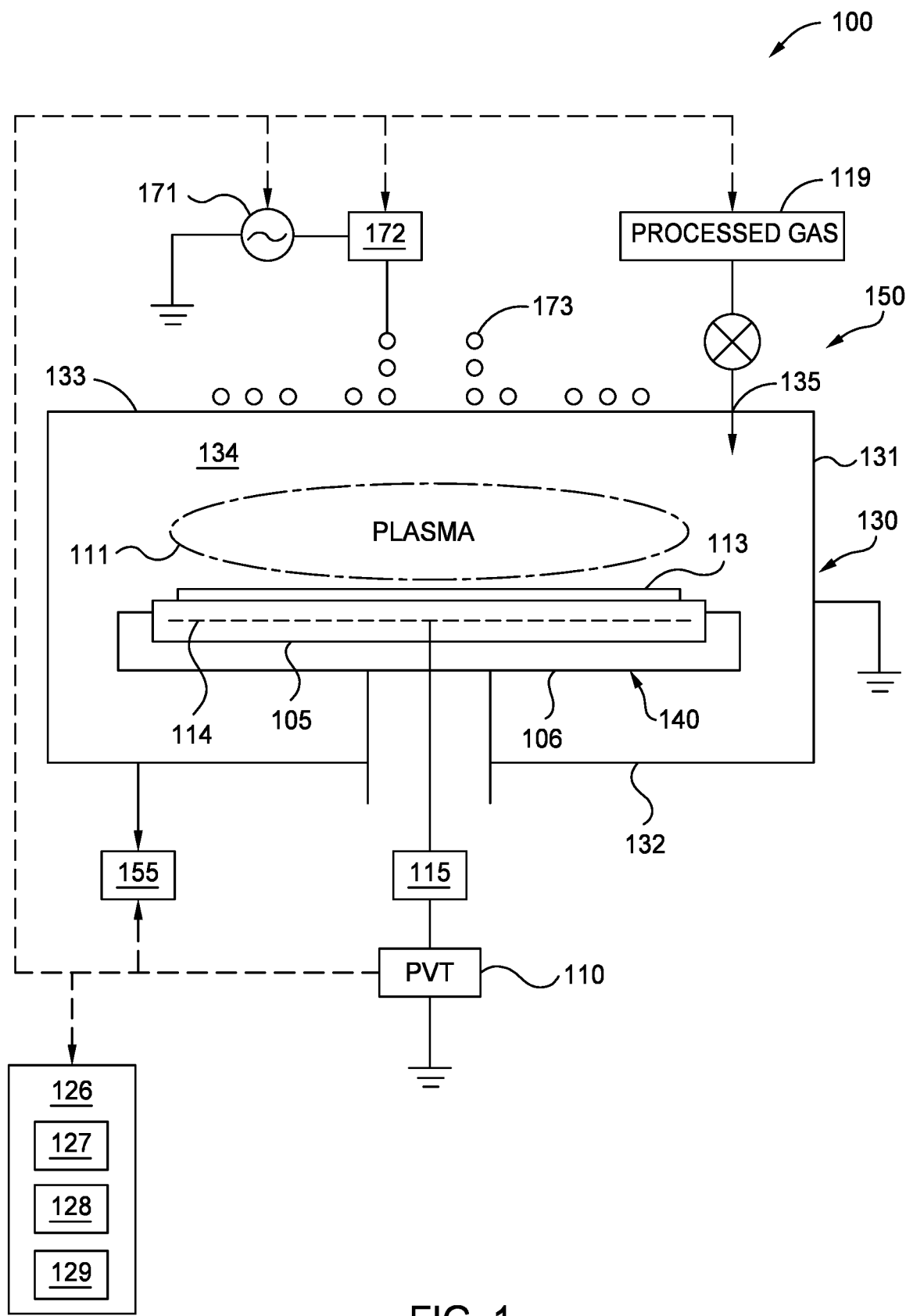
FIG. 1 is a schematic side cross-sectional view of a plasma processing system, according to one or more embodiments, configured to practice methods set forth herein.

FIG. 1a is a schematic view of a plasma processing system 100 that is adapted to process a substrate 113 disposed on a substrate support assembly 140 by generating a plasma 111 within the processing volume 134 of a plasma processing chamber 150. The plasma processing system 100 is configured to form an inductively coupled plasma (ICP), where the processing chamber 150 includes a coil 173 disposed over a portion of the processing volume 134 so that at least a portion of the coil is facing a biasing electrode 114 that is also disposed within substrate support assembly 140 that is disposed within the processing volume 134. The biasing electrode 114 is also often referred to herein as a substrate support electrode. The ICP plasma processing source similarly includes a radio frequency (RF) generator 171 that is electrically coupled to the upper coil 173 through an RF match 172, and delivers a tuned RF signal that is configured to ignite and maintain the plasma 111 formed in the processing volume 134. The biasing electrode 114 is coupled to a pulsed voltage (PV) waveform generator 110, which is electrically coupled to the biasing electrode 114 through an RF filter 115 that is configured to prevent RF signals from making their way to the PV waveform generator 110 during processing. In some embodiments, the RF generator 171 is configured to deliver an RF waveform signal having a frequency that is greater than 1 megahertz (MHz) or more, or about 2 megahertz or more, such as about 13.56 megahertz or more through an RF match 172 that is connected to the coil 173.

The processing chamber 150 typically includes a chamber body 130 that includes one or more sidewalls 131 and a chamber base 132, which collectively, with a chamber lid 133, define the processing volume 134. The one or more sidewalls 131 and chamber base 132 generally include materials that are sized and shaped to form the structural support for the elements of the processing chamber 150 and are configured to withstand the pressures and added energy applied to them while a plasma 111 is generated within a vacuum environment maintained in the processing volume 134 of the processing chamber 150 during processing. In one example, the one or more sidewalls 131 and chamber base 132 are formed from a metal, such as aluminum, an aluminum alloy, or a stainless steel alloy. A gas inlet 135 disposed through the chamber lid 133 is used to deliver one or more processing gases to the processing volume 134 from a processing gas source 119 that is in fluid communication therewith. The processing gases provided by the processing gas source 119 include reactive etchant gases and inert gases. The pressure within the processing chamber 150 is controlled by use of a vacuum pump 155 and an amount of gas flow provided from the processing gas source 119. A substrate 113 is loaded into, and removed from, the processing volume 134 through an opening (not shown) in one of the one or more sidewalls 131, which is sealed with a slit valve (not shown) during plasma processing of the substrate 113.

The substrate support assembly 140 can include a substrate support 105 (e.g., ESC substrate support) and one or more biasing electrodes, which are coupled to PV waveform generator 110. In some embodiments, the substrate support assembly 140 can additionally include a support structure 106 that includes a support base, which supports the substrate support 105, an insulator plate and a ground plate that is coupled to the chamber base 132. The support base is electrically isolated from the chamber base 132 by the insulator plate, and the ground plate is interposed between the insulator plate and the chamber base 132. The substrate support 105 may be thermally coupled to and disposed on the support base, which is configured to regulate the temperature of the substrate support 105 during processing.

Typically, the substrate support 105 is formed of a dielectric material, such as a bulk sintered ceramic material, such as a corrosion-resistant metal oxide or metal nitride material. In embodiments herein, the substrate support assembly 140 further includes the biasing electrode 114 embedded in the dielectric material thereof. In one configuration, the biasing electrode 114 is a chucking pole used to secure (i.e., chuck) the substrate 113 to the substrate supporting surface of the substrate support assembly 140 and to bias the substrate 113 with respect to the processing plasma 111 using one or more of the pulsed-voltage biasing schemes. Typically, the bias electrode 114 is formed of one or more electrically conductive parts, such as one or more metal meshes, foils, plates, or combinations thereof. In some embodiments, the biasing electrode 114 is also electrically coupled to a clamping network that is configured to provide a chucking voltage thereto, such as static DC voltage between about −5000 V and about +5000 V.

A system controller 126, also referred to herein as a processing chamber controller, includes a central processing unit (CPU) 127, a memory 128, and support circuits 129. The system controller 126 is used to control the process sequences and methods used to process the substrate 113, including the substrate processing methods described herein. The CPU 127 is a general-purpose computer processor configured for use in an industrial setting for controlling the processing chamber and sub-processors related thereto. The memory 128 described herein, which is generally non-volatile memory, may include random access memory, read-only memory, floppy or hard disk drive, or other suitable forms of digital storage, local or remote. The support circuits 129 are conventionally coupled to the CPU 127 and comprise cache, clock circuits, input/output subsystems, power supplies, and the like, and combinations thereof. Software instructions (software program) and data can be coded and stored within the memory 128 for instructing a processor within the CPU 127. A software program (or computer instructions) readable by CPU 127 in the system controller 126 determines which tasks are performable by the components in the processing system 100. Typically, the software program, which is readable by CPU 127 in the system controller 126, includes code, which, when executed by the processor (CPU 127), performs tasks relating to the plasma processing methods described herein. The program may include instructions that are used to control the various hardware and electrical components within the processing chamber 150 and processing system 100 to perform the various process tasks and various process sequences used to implement the methods described herein.

As noted above, a PV waveform generator 110 is adapted to provide a voltage waveform to one or more electrodes, such as the biasing electrode 114, disposed within the processing chamber 100. In some embodiments, each PV waveform generator 110 is configured to deliver between 1 and 25 kilowatts (kW) of DC power at a voltage of between 100 and 10,000 volts, such as between 1000 and 5000 volts to an electrode.

The system controller 126 and supporting circuitry are configured to control and/or adjust the voltage waveforms generated by the PV waveform generators 110. The PV waveform generators 110, system controller 126 and supporting circuitry are able to adjust multiple electrical parameters that are used to alter one or more of the voltage waveform characteristics, such as frequency, waveform shape, and applied voltage on-time during a pulse period of a provided asymmetric voltage waveform.

While the disclosure provided herein, primarily discusses the use of the processing system 100 to perform a plasma-assisted etching processes, such as a reactive ion etch (RIE) plasma processing technique, this configuration is not intended to limit the scope of disclosure provided herein. It should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

Figure 2:
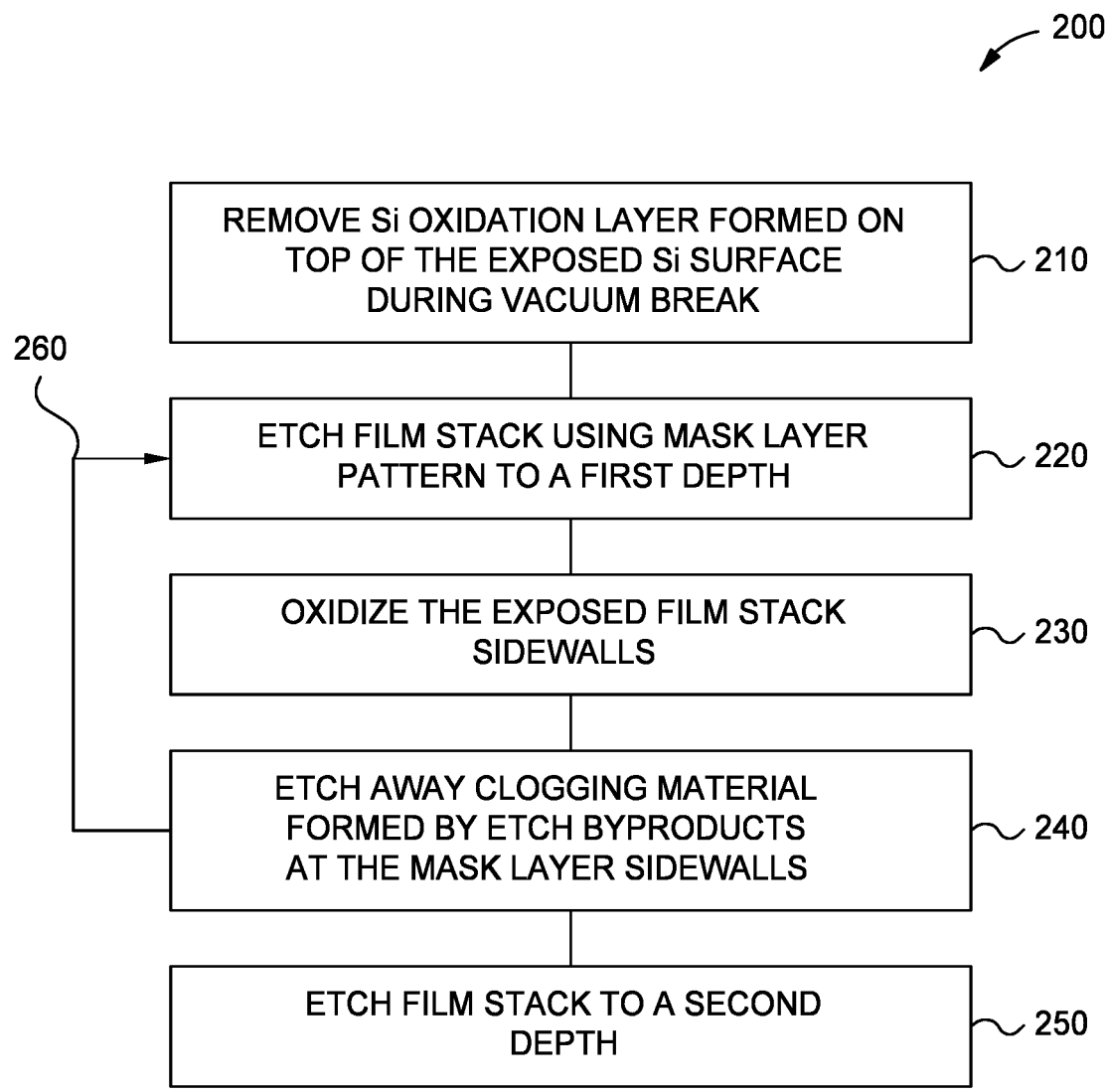
FIG. 2 is a flow diagram of a method for etching high aspect ratio structures, according to certain aspects of the present disclosure.

FIG. 2 depicts an etch method 200 which comprises a plurality of operations to etch high aspect ratio device structures. Operation 210 is a breakthrough process. Operation 220 is a main etch process. Operation 230 is a passivation process. Operation 240 is a passivation layer treatment process. Operation 250 is a repetition of the main etch process of operation 220. FIGS. 3A-3H are representative illustrations of a device structure undergoing the various processes of method 200.

Figure 3A:
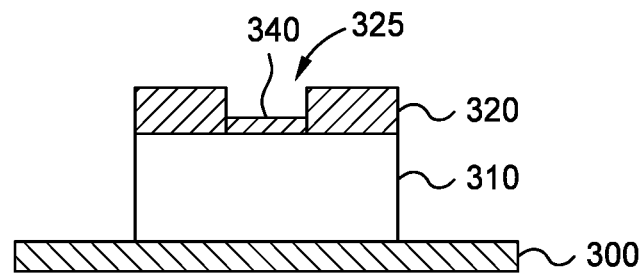
FIGS. 3A, 3B, 3C, 3D, 3E, 3F, 3G, and 3H illustrate a schematic view of a device structure undergoing an etch process in accordance with the method of FIG. 2, according to certain aspects of the present disclosure.

Integrated circuit manufacturing employs the use of a substrate 300 as shown in FIG. 3A as the foundation to create film stacks that can be later etched to create devices, such as, 3D DRAM devices. These substrates 300 may have a variety of layers deposited thereon by multiple commonly known processes utilized in the semiconductor industry. These processes can deposit multiple nano-scaled layers upon each other to create a film stack 310 as illustrated in FIG. 3A. The film stacks 310 can be utilized to make electrical connections, electric gates, and the like through etch processes. Moreover, the film stack 310 can include multiple materials in alternating layers. Therefore, selection of the material used in the film stack 310 is carefully considered to achieve the desired result.

Once the desired film stack 310 on the substrate 300 is formed, the film stack 310 may be, for example, etched in a typical etch chamber to create the desired devices within, in, or on the top surface of the film stack 310. However, simply etching the film stack would likely result in the entirety of the top surface of the film stack slowly being removed. Therefore, mask layers 320 have been developed to protect portions of the film stack while leaving exposed portions vulnerable to etch. Furthermore, the mask layer 320 can be patterned to protect or expose certain portions as illustrated by pattern opening 325. For example, a mask layer 320 containing a pattern opening 325 of a circle cutaway atop the film stack 310 will leave a circle portion exposed to the etch process and thus may create a cylinder-shaped recess in the film stack 310. In some embodiments, the mask layer 320 is etch proof. In other embodiments, the mask layer 320 is etch resistant wherein the etch process slowly etches away the mask layer 320 while ideally etching away the exposed film stack 310 at a more rapid rate. Therefore, by having a patterned mask layer 320, whether etch proof or etch resistant, atop of a film stack 310, desired structures can be created by etching the exposed areas.

FIG. 3A illustrates the operation 210 (the "breakthrough" process) in which the film stack 310 is disposed above the substrate 300. The mask layer 320 is disposed above the film stack 310. In some embodiments, the mask layer 320 comprises silicon oxide, or carbon-containing material. In other embodiments, the mask layer comprises only silicon oxide with a thickness of 100 nanometers to 10,000 nanometers such as, for example about 1,000 nanometers to about 10,000 nanometers, such as about 1,000 nanometers to about 2,000 nanometers. In some embodiments, the film stack 310 comprises multiple layers of pure silicon. In other embodiments, the film stack 310 comprises multiple alternating silicon and silicon-germanium layers. The number of layers can be several to several hundreds, for example, 2 to 1,000 layers, such as, up to 10, 50, 100, 200, 300, 400, 500, 600, 700, 800, 900, or up to 1000 layers, building a film stack of up to several micro-meters to several tens micro-meters, for example, 1 to 100 micro-meters, such as up to 5, 10, 20, 30, 40, 50, 60, 70, 80, 90, or up to 100 micro-meters.

Figure 3B:
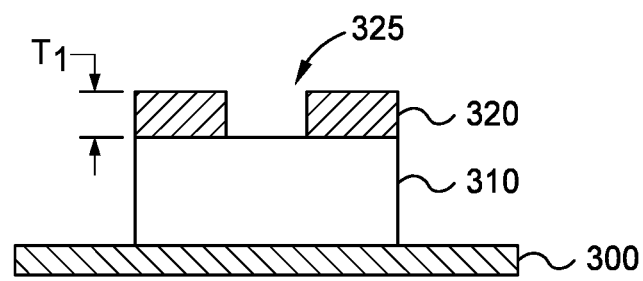

Once the film stack 310 has been formed within a deposition chamber, it may be stored for future processing or it may be transferred to an etch chamber, such as the chamber 150 of the processing system 100, for processing. Typically a thin silicon oxide layer 340 naturally forms on any reacting silicon surface as a result from air exposure. Air oxidizes silicon to produce a thin film (or layer) of silicon oxide. This thin silicon oxide layer 340 may be removed prior to the film stack 310 etching. As shown in FIG. 3A, the film stack 310 contains a reactive silicon containing surface between the mask layer 320 patterned opening thereby forming a thin silicon oxide layer 340. In this embodiment the mask layer 320 is a silicon oxide mask represented with a thickness, T1, of about 1,000 to 2,000 nanometers. The thin silicon oxide layer 340 may be removed by a breakthrough (or "pre-clean") process in which the thin silicon oxide layer 340 is plasma etched with hydrogen radicals from energized hydrogen gas. In the alternative, argon radicals may be used to etch the thin layer of silicon oxide 340. The resulting substrate assembly is illustrated in FIG. 3B after the breakthrough process of operation 210 has been performed. The breakthrough process utilizes a low source and bias power to energize a gas mixture of nitrogen trifluoride ($NF_3$), argon (Ar), and oxygen ($O_2$) at a low chamber pressure of about 40 milliTorr to about 60 milliTorr to clean any native oxidation layers formed from ambient air exposure. FIG. 3B depicts a smooth silicon oxide mask layer 320; however, in practice, the removal of the thin silicon oxide layer 340 may minimally etch the silicon oxide mask layer 320 equal to the thickness of the thin silicon oxide layer 340.

Figure 3C:
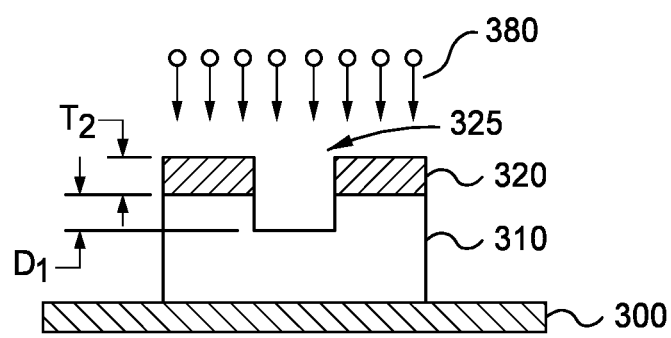

In operation 220 of FIG. 2, an etch process is performed to a first depth of the exposed areas of the film stack 310. The etch process of operation 220 may include plasma ion bombardment through a bias created sheath located above an electrostatic chuck supporting the substrate 300. The etch process may include an etch power source of about 1,000 watts to about 4,000 watts, such as about 1,000 watts to about 3,000 watts, such as about 1,300 watts to about 2,100 watts, at about 13.56 megahertz frequency and a bias power of about 2,000 watts to about 5,000 watts at 2 megahertz, such as about 3,000 watts to about 5,000 watts, such as about 4,000 watts to about 4,500 watts, with a chamber pressure from about 10 milliTorr to about 100 milliTorr at a temperature of about −50 degrees Celsius to about 200 degrees Celsius maintained by the electrostatic chuck. In one embodiment, a gas mixture comprising of chlorine gas ($Cl_2$), hydrogen bromide (HBr), oxygen ($O_2$), argon (Ar), or a combination thereof, is energized for etching for a duration of about 10 seconds to about 200 seconds. FIG. 3C illustrates plasma ion particles 380 vertically etching a recess in the exposed area of the film stack 310 to a first depth, D1. The first depth, D1, is etched to about 2 nanometers to about 300 nanometers, such as, about 100 nanometers to about 300 nanometers, such as about 200 nanometers. Without being bound by theory, the etching performed from the plasma ion particles 380, via vertical ion bombardment, etches the silicon oxide of the mask layer 320 at a slower rate than the film stack 310 comprising silicon or silicon-germanium layers. In one embodiment, the etch rate may be set at about 100 nanometer per minute to about 200 nanometer per minute depending on the RF and bias power levels utilized. However, the thickness of the silicon oxide mask may be reduced by about 10 nanometers to about 100 nanometers, while, for example, the silicon or silicon-germanium layer of the film stack 310 may be etched about 70 nanometers to about 700 nanometers. Therefore, the silicon oxide mask layer 320 resists the etch process operation 220 but experiences a slight reduction of thickness. FIG. 3C depicts the thickness of the silicon oxide mask layer 220 as T2. Thickness, T2, is less than thickness T1 shown in FIG. 3B (pre-etch operation).

Figure 3D:
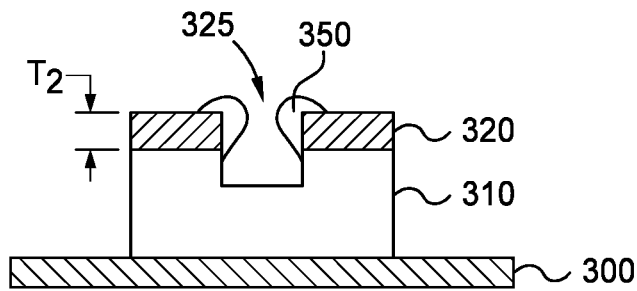

The etching process of operation 220 produces a removal byproduct 350 comprising an etched away film stack 310 material. The byproduct 350 particle generally floats up the recess and toward the plasma and is exhausted out of the chamber 150 through the chamber exhaust pathway coupled to the vacuum pump 155. However, not all of the material is exhausted but rather deposits itself on the nearest surface where volume expands beyond the critical dimension (or width) of the etched recess. Without being bound by theory, the etched silicon (or silicon-germanium) byproduct 350 adheres to the silicon oxide mask layer 320 creating a narrowing (or pinching off) of the patterned opening 325 of the mask layer 320. This narrowing of the patterned opening 325 creates an obstacle for a subsequent etch process as the ions are unable to reach the entire horizontal bottom portion of the recess thereby unable to create high aspect ratio feature by repetitive etch processes. Empirically, a vertical profile of the etched recess is altered during the etch process as byproduct 350 adheres to the inner sidewalls of the mask layer 320. Theoretically, a substantially vertical profile of an etched recess can be created by controlling the etch process of operation 220 as shown in FIG. 2. Such control parameters include depth etching prior to deformation of the recess, time of etch, and saturation time of an oxygen containing gas exposure prior to etch, etch gas mixture compositions, and chamber pressure. FIG. 3D depicts an illustration of the narrowing of the patterned opening 325. To combat the pinching narrowing to the mask layer 320, the inventors have realized actively clearing the mask layer 320, allows for a uniform profile while achieving deeper etching.

Figure 3E:
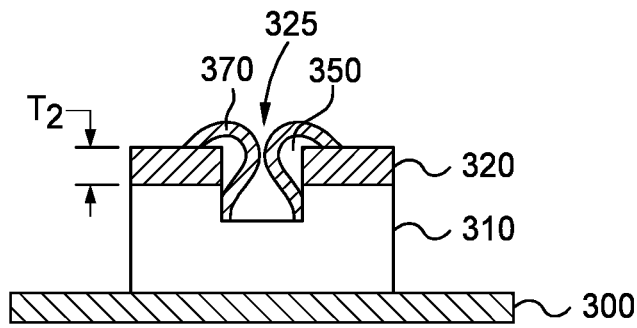
Figure 3F:
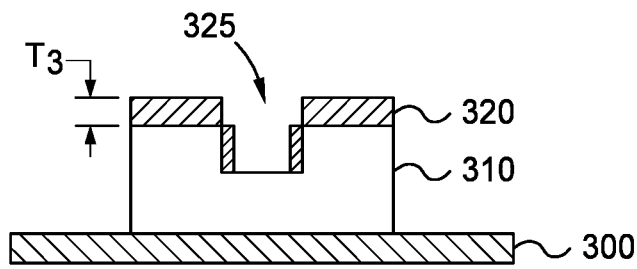

One method that clears the removal byproduct 350 narrowing of the patterned opening 325 is to treat the substrate assembly by forming a passivation layer 370 followed by a passivation layer etch treatment as depicted in FIGS. 3E and 3F and operations 230 and 240 of FIG. 2. The passivation layer 370 comprises a silicon oxide deposition by use of an oxygen containing gas. The oxygen within the oxygen containing gas reacts with any exposed silicon reactive surfaces such as, the film stack recess inner sidewalls and the byproduct 350 buildup on the mask layer 320. Without being bound by theory, the oxygen that oxidizes the silicon is more reactive near the upper portion of the recess along the film stack 310 sidewalls and the sidewall of the mask layer 320 as oxygen particles first react to the portions nearest the opening. Furthermore, oxidation of the exposed silicon is controlled by a 2,500 watt source power with about 50 watt to about 100 watt bias power (at about 13.56 megahertz) and about 120 standard cubic centimeter (sccm) oxygen flowrate in about 8 second to about 20 second, such as about 10 second to about 20 second time intervals. Although some oxidation occurs within the recess, the silicon oxide layer (or passivation layer) 370 that forms from the passivation operation 230 is gradually thinner nearest the deepest portion of the recess.

Operation 240 of FIG. 2, includes treating the passivation layer 370 with a controlled plasma etch process designed to target a depth equal to the mask layer thickness, T2. The passivation treatment plasma comprises utilizing a 2,100 watt power source and a bias power of about 50 watts to about 100 watts (at 13.56 megahertz) to energize a gas mixture of nitrogen trifluoride ($NF_3$), argon (Ar), and oxygen ($O_2$) under a pressure of about 20 milliTorr to about 60 milliTorr for a duration of 10 seconds to about 100 seconds. Therefore the byproduct 350 build up along the inner sidewalls of the mask layer 320 is effectively removed and cleared with minimal removal (or damage) of the silicon oxide passivation layer 370 located within the sidewalls of the of the film stack 310 recess below the thickness T3 of FIG. 3F. It is noted that the treatment of the passivation layer 370 reduces the thickness of the mask layer to a thickness, T3 wherein thickness, T3, is thinner than thickness, T2, of FIG. 3E. This passivation treatment method allows for an unimpeded opening of the mask layer 320 for a subsequent etch process. The exposed sidewalls of the mask layer 320 and the remaining silicon oxide passivation layer 370 on the sidewalls of the recess allow for the next etch process to reach the deepest portion of the recess with minimal lateral profile etching and thereby achieving a targeted deeper etch while maintaining the target critical dimension (width) of desire. FIG. 3F illustrates the remaining substrate assembly after the passivation treatment.

Figure 3G:
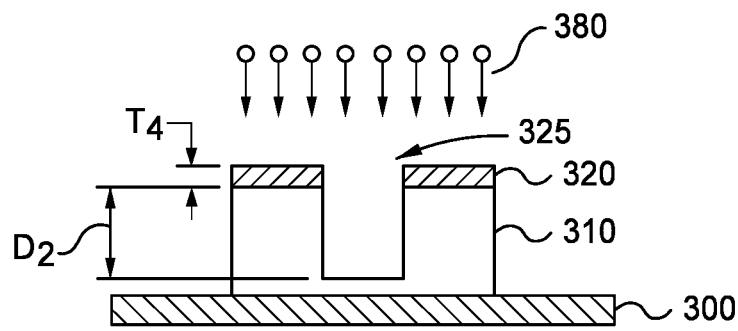

Operation 250 of FIG. 2 and as depicted in the illustration of FIG. 3G, a subsequent etch process, similar to the operation 220, is performed such that the vertical etch occurs to reach a second depth, D2. It is noted that the method described in FIG. 2 may be repeated (illustrated by iteration path 260) to achieve the desired depth or high aspect ratio structures on the substrate 300. The term second depth may be in the final depth desired. For example, operations 220-240 may be performed iteratively until the resulting structures reach a high aspect ratio of 100:1 or greater. With each etch operation, a limiting factor may be the resulting thickness of the silicon oxide mask layer 320 as the layer is reduced in thickness.

After the desired depth is achieved for the recess, the silicon oxide mask layer 320 may be removed through a wet acid dip that dissolves any residual silicon oxide, including the mask layer 320 and any remaining passivation layer material. The wet acid dip comprises soaking the substrate assembly in an acid such as, for example, hydrofluoric acid. The resulting device structure is illustrated in FIG. 3H showing a smooth upper surface of the film stack 310 without a silicon oxide mask layer 320.

Figure 4:
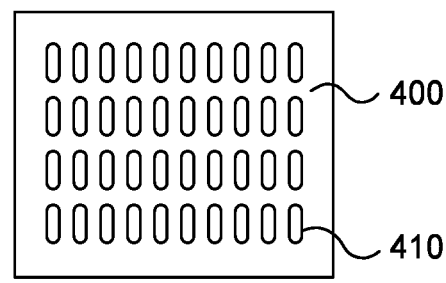
FIG. 4 illustrates a top mask layer, according to certain aspects of the present disclosure.

FIG. 4 depicts an exemplary mask layer 400 with patterned openings 410 in an oblong-shape. However, many shapes have been contemplated such as for example, but not limited to, circles, squares, diamonds, ovals, triangles, or the like, as the patterned openings 410. The patterned openings 410 may be aligned in both equally spaced rows and columns as depicted in FIG. 4 or may be arranged in many other configurations that create the desired device structures.

Figure 3H:
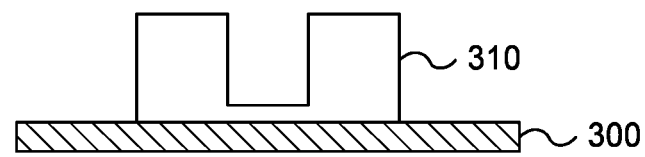
Figure 5:
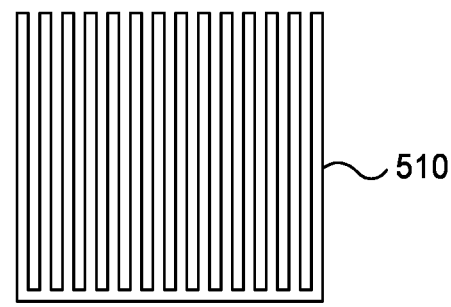
FIG. 5 illustrates a cross-sectional view of a device formed according to certain aspects of the present disclosure.

FIG. 5 depicts a cross-sectional view of the plurality of film stack device structures expanding on the view of the single recess illustrated in FIG. 3H. The film stack 310 shows a smooth upper surface of the film stack 310 without a silicon oxide mask layer. Each of the film stack structures correspond to an active layer for 3D DRAM devices.

Figure 6:
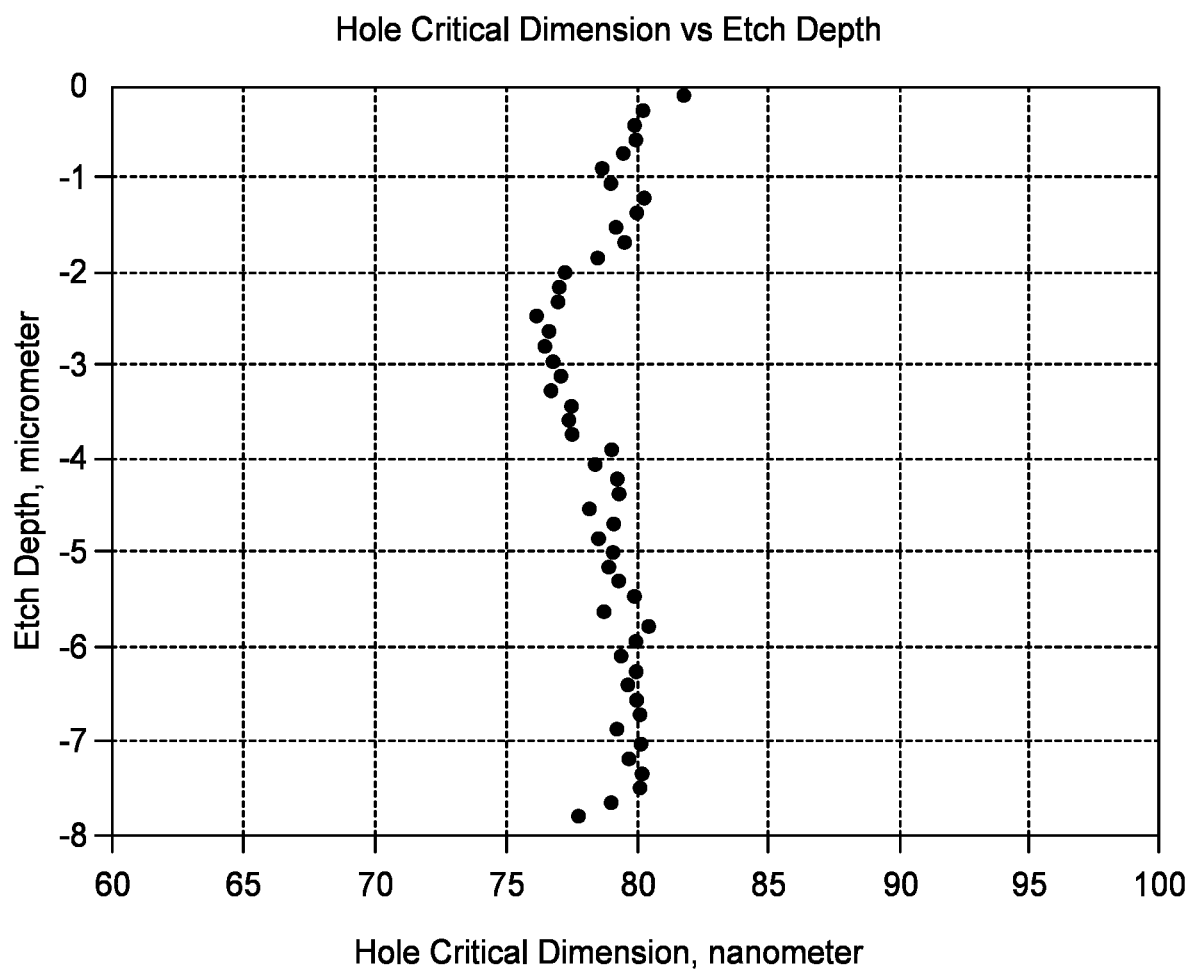
FIG. 6 illustrates a chart representing a vertical profile of the device formed according to certain aspects of the present disclosure.

FIG. 6 depicts a collection of critical dimension measurements reflecting the multiple etch iterations of method 100 as the recess is deepened by each etch. A substantially vertical 100:1 high aspect ratio structure at an etch depth of about 8 micrometers requires a recess (or hole) critical dimension (or width) of about 80 nanometers along the vertical profile of the film stack recess. It is noted that deviation from a tolerance of about 10 nanometers of the sought critical dimension results in substrate bowing, deformations, and a likelihood of premature failure. Stated differently, the tolerance of about 10 nanometers corresponds to a deviation of the center of the recess of within 5 nanometers in any radial direction. While FIG. 6 only depicts results of a etch depth of 8 micrometers, the inventors have achieved similar results using an etch depth of 10 micrometers while maintaining a critical dimension of about 100 nanometers along the vertical profile of the film stack recess while maintaining a critical dimension tolerance of about 10 nanometers. Therefore, implementation of method 100 yields a substantially vertical recess that achieves 100:1 high aspect ratio device structures for depths up to 10 micrometers.

All numerical values are "about" or "approximately" the indicated value, and take into account experimental error and variations that would be expected by a person having ordinary skill in the art.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby.

Certain embodiments and features have been described using a set of numerical minimum values and a set of numerical maximum values. It should be appreciated that ranges including the combination of any two values, e.g., the combination of any minimum value with any maximum value, the combination of any two minimum values, and/or the combination of any two maximum values are contemplated unless otherwise indicated. Certain minimum values, maximum values, and ranges appear in one or more claims below.

What is claimed is:

1. A method of patterning a substrate comprising:
   (a) etching a substrate with a first etchant to form a recess to a first depth within the substrate, the substrate having a mask layer disposed thereon, wherein an etch byproduct from the substrate forms a clogging material at a top of the recess;
   (b) depositing a passivation layer on the clogging material and sidewalls of the recess;
   (c) performing a second etch operation with a second etchant on the passivation layer to remove the clogging material formed from the etch byproduct on the mask layer; and
   (d) etching with the first etchant the recess to a second depth.

2. The method of claim 1, wherein the first depth is about 2 nanometers to about 300 nanometers.

3. The method of claim 2, wherein the first depth is about 200 nanometers.

4. The method of claim 1, wherein depositing the passivation layer comprises exposing the substrate to a plasma formed from an oxygen containing precursor gas.

5. The method of claim 1, wherein depositing the passivation layer further comprises generating an oxygen plasma with about 2,500 W RF power and about 100 W bias power at about 13.56 MHz.

6. The method of claim 1, wherein treating the passivation layer comprises exposing a sidewall of the mask layer.

7. The method of claim 1, wherein the substrate comprises a plurality of silicon layers or alternating silicon and silicon germanium layers.

8. The method of claim 1, wherein the treating the passivation layer further comprises generating a plasma from a gas mixture of $NF_3$, Ar, and $O_2$ under a pressure of about 20 milliTorr to about 60 milliTorr.

9. The method of claim 8, wherein the treating the passivation layer further comprises exposing the substrate for a duration of about 10 seconds to about 100 seconds.

10. The method of claim 1, where in etching a substrate further comprises generating a plasma from a gas mixture comprising $Cl_2$, HBr, and $O_2$.

11. The method of claim 10, wherein generating a plasma uses a 4,000 watts to about 4,500 watts bias power.

12. The method of claim 1, where in etching the recess further comprises generating a plasma from a gas mixture comprising $Cl_2$, HBr, and $O_2$.

13. The method of claim 12, wherein generating a plasma uses a 4,000 watts to about 4,500 watts bias power.

14. The method of claim 1, wherein (a), (b), (c), and (d) are repeated until the recess has an aspect ratio of at least 100:1.

15. The method of claim 1, wherein maintaining a minimum variation of a recess sidewall width comprises maintaining the variation to within about 10 nanometers.

16. A method of patterning a substrate comprising:
   (a) etching a substrate to remove a thin layer of oxidation to expose a silicon containing film stack;
   (b) etching the substrate to form a recess to a first depth within the film stack, the substrate comprising a mask layer disposed above the film stack, the mask layer having inner sidewalls, wherein an etch byproduct from the substrate forms a clogging material at a top of the recess, wherein etching the substrate comprises:

generating a plasma from a gas mixture of $Cl_2$, HBr, $O_2$, and Ar; and exposing the substrate to the plasma for about 10 seconds to about 200 seconds;

(c) oxidizing the etch byproduct, the sidewalls of the recess and the inner sidewalls of the mask layer by exposing the substrate to a generated oxygen plasma for about 10 seconds to about 20 seconds, the mask layer inner sidewalls having the etch byproduct, wherein the etch byproduct is silicon-containing;

(d) exposing the mask layer sidewalls by a controlled etch removing the etch byproduct, the controlled etch comprising:

generating a plasma from a gas mixture of $NF_3$, Ar, and $O_2$; and exposing the substrate to the plasma for about 10 seconds to about 200 seconds;

(e) repeating (b), (c), (d); and (f) etching the recess to a final depth while maintaining vertical profile of the first depth to within 5 nanometers of a center of the recess, etching the recess to a second depth.

17. The method of claim 16, wherein the final depth is a 100:1 aspect ratio structure.

* * * * *